United States Patent [19]

Reese et al.

[11] 4,065,678
[45] Dec. 27, 1977

[54] CLAMPED PUSH-PULL DRIVER CIRCUIT WITH OUTPUT FEEDBACK

[75] Inventors: Edmund Arthur Reese, Sugarland, Tex.; Charles Shelley Meyer, Tempe; George S. Leach, Jr., Phoenix, both of Ariz.

[73] Assignee: Motorola, Inc., Schaumburg, Ill.

[21] Appl. No.: 702,366

[22] Filed: July 2, 1976

[51] Int. Cl.² .................. H03K 5/08; H03K 19/08; H03K 19/40
[52] U.S. Cl. .................. 307/237; 307/205; 307/214; 307/264; 307/270; 307/DIG. 4
[58] Field of Search ............ 307/205, 251, 297, 237, 307/270, 304, 214, DIG. 4, 264

[56] References Cited

U.S. PATENT DOCUMENTS

| | | | |
|---|---|---|---|
| 3,631,267 | 12/1971 | Heimbigner | 307/237 X |
| 3,903,431 | 9/1975 | Heeren | 307/214 X |
| 3,912,948 | 10/1975 | Bapat | 307/DIG. 4 X |
| 3,970,875 | 7/1976 | Leehan | 307/251 X |
| 3,975,649 | 8/1976 | Kawagoe et al. | 307/214 X |
| 3,989,955 | 11/1976 | Suzuki | 307/214 X |

OTHER PUBLICATIONS

Gardner, "FET Off-Chip Driver Clamping;" IBM Tech. Discl. Bull.; vol. 16, No. 1, pp. 275-276, 6/1973.

*Primary Examiner*—John S. Heyman
*Assistant Examiner*—Larry N. Anagnos
*Attorney, Agent, or Firm*—Joe E. Barbee

[57] ABSTRACT

A clamped push-pull driver circuit suitable for driving high capacitive loads includes a bootstrap MOS inverter circuit driving an MOS push-pull driver circuit. A regulator circuit including a plurality of diode-connected MOSFETs is coupled between the output of the MOS bootstrap inverter and a ground conductor. A MOSFET (the feedback device) having its gate electrode coupled to the output of the MOS push-pull circuit is connected in series with the diode-connected MOSFETs. Rapid rise time and short delay are achieved at the output of the clamped push-pull driver circuit, since the regulator circuit does not begin to conduct current (i.e., does not start the clamping action) until the output voltage of the push-pull driver circuit has exceeded two thresholds. Thus a large drive capability is provided to initiate the rising action of the output signal and clamping only begins to occur after the output is already rising towards a higher virtual final level than that which clamping will allow. This delayed clamping action is controlled by the feedback MOSFET which is positioned between two of the diode-connected MOSFETs so that the feedback MOSFET is not turned on until the desired voltage is achieved at the output of the MOS push-pull driver circuit. The output of the MOS push-pull driver will continue to rise until it reaches a level which is one threshold below that set by the plurality of diode-connected MOSFETs. The final voltage, at the end of the rise time, at the output of the MOS push-pull driver circuit tracks with the MOS threshold voltage.

3 Claims, 2 Drawing Figures

CLAMPED PUSH-PULL DRIVER CIRCUIT WITH OUTPUT FEEDBACK

BACKGROUND OF THE INVENTION

MOS bootstrap inverters and MOS push-pull drivers are well known in the art. They are frequently combined in an integrated circuit to produce circuits which are capable of driving large capacitive loads with fast rise time waveforms. However, such circuits provide output voltages which are either equal to the power supply voltage level or the ground voltage level, and are consequently not suitable for providing a regulated bias voltage which tracks with the threshold voltage of the MOSFETs. Other bias circuits have been implemented utilizing MOSFETs, but most of them are DC circuits. Prior circuits which are capable of providing a switchable bias voltage have very poor transient response, that is, they do not have rapid rise and fall times. Known MOS circuits are not capable of providing an output pulse having sharp rise and fall times and yet having a pulse magnitude which tracks with the MOSFET threshold voltage.

SUMMARY OF THE INVENTION

It is an object of this invention to provide a circuit which produces an output having a fast rise and fall time and having a magnitude limited by a regulator circuit responsive to said circuit and to variations in threshold voltage. Briefly described, the invention is a circuit including an inverter, and a driver circuit having an input coupled to an output of the inverter, and a regulator circuit coupled to the output of the inverter and responsive to the output of the driver circuit for regulating the voltage at the output of the inverter and thus at the output of the driver in response to the voltage produced at the output of the driver circuit.

DESCRIPTION OF THE INVENTION

Figure 1:
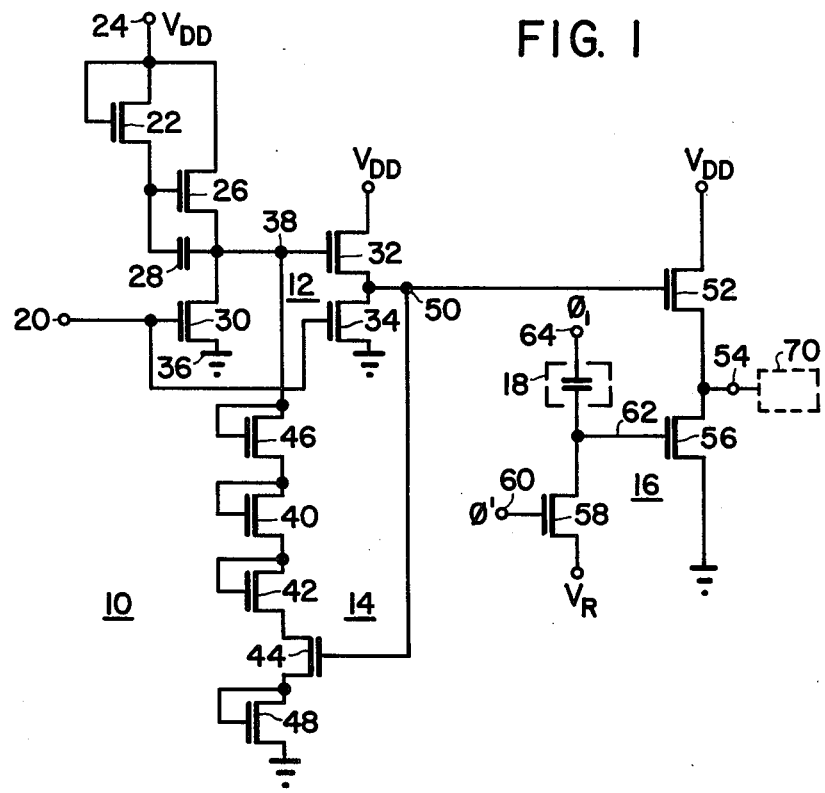
FIG. 1 is a schematic diagram of a presently preferred embodiment of the invention.

Referring to FIG. 1, clamped push-pull driver circuit 10 includes a MOS bootstrap driver circuit 12 including a bootstrap inverter and a push-pull driver circuit. Circuit 10 also includes a regulator circuit 14, a first group of charge coupled devices (CCD's) 18, and a second group of CCD's 70 and a CCD regeneration circuit 16.

The bootstrap inverter includes MOSFETs 22, 26, and 30. MOSFET 22 has its gate and drain connected to $V_{DD}$ conductor 24. MOSFET 26 is connected between $V_{DD}$ and node 38 and has its gate connected to the source of MOSFET 22. Bootstrap feedback capacitor 28 is connected between the gate and source of MOSFET 26. MOSFET 30 is connected between node 38 and ground conductor 36 and has its gate electrode connected to input 20.

The push-pull drive circuit includes MOSFETs 32 and 34. MOSFET 32 is connected between $V_{DD}$ and node 50 and has its gate connected to anode 38. MOSFET 34 is connected between node 50 and ground conductor 36 and has its gate connected to input 20.

Regulator 14 includes diode-connected MOSFETs 46, 40, 42, 48, and MOSFET 44 connected in series between node 38 and ground conductor 36. The gate electrode of MOSFET 44 is connected to node 50.

Those skilled in the art will recognize that the term MOSFET is a commonly used acronym for Metal Oxide Semiconductor Field Effect Transistor, and is used synonymously with the acronym IGFET, or Insulated Gate Field Effect Transistor. They will also recognize that the integrated circuit MOSFET is a bilateral device having a gate electrode, and source and drain electrodes which are functionally interchangeable, depending on their relative voltages. A more detailed description of MOSFETSs can be found in "Physics and Technology of Semiconductor Devices" by Grove, John Wiley and Sons, 1967.

Regenerator circuit 16 includes MOSFETs 52, 56, and 58. This regeneration circuit is intended to show one possible use (of many possible uses) for a circuit having the characteristics of bootstrap driver circuit 12 and regulator 14.

Figure 2:
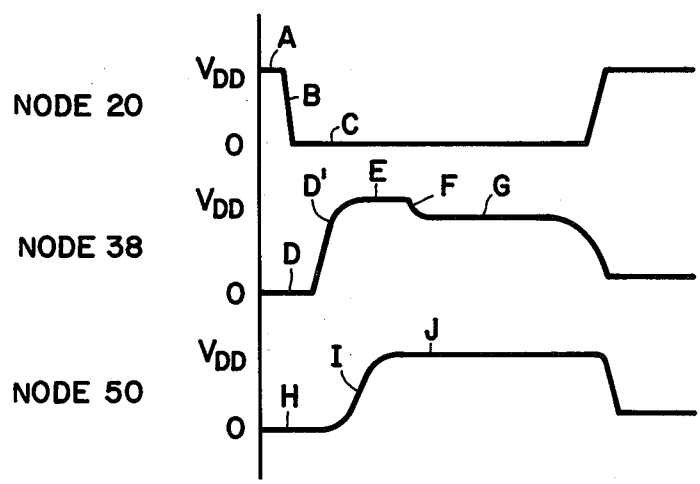
FIG. 2 is a diagram illustrating waveforms at several nodes of the embodiment of FIG. 1.

The operation of circuit 12 and 14 is best described by referring to the waveforms of FIG. 2.

Referring to the waveform at node 20 in FIG. 2, the input to the circuit of FIG. 10 is initially at voltage A, which may be $V_{DD}$ volts. Node 20 then undergoes a transition B to level C, which is very close to 0 volts. When node 20 is at level A, MOSFET 30 is on, holding node 38 at approximately 0 volts (level D). As node 20 undergoes transition B, node 38 starts to rise (after some delay) as indicated by transition D' on the waveform of node 38 in FIG. 2. The bootstrapping action of capacitor 28 in combination with MOSFETs 22 and 26 is well known and will not be described, except to note that the voltage at node 38 may rapidly rise to $V_{DD}$ volts. Prior to transition D', node 50 will initially be at level H, approximately 0 volts, because MOSFET 34 is on and MOSFET 32 is of. Consequently, MOSFET 44 will also be off so that initially the series connection of MOSFETs 46, 40, 42, 44, and 48 have no serious inhibiting affect on the transition D' of node 38. Consequently, node 50 undergoes a very rapid transition I up to level J', at which point MOSFET 44 turns on, limiting any further increase of voltage at node 38 above level E, and possibly even decreasing the voltage at node 38 somewhat along transition F to a steady voltage G. The level J is established by the threshold voltages of MOSFETs 32, 46, 40, 42, and 48. The feedback MOSFET 44 can be, for example, placed between MOSFETs 42 and 40 instead, thereby raising the level at which the clamping action is initiated.

Of course, when node 20 returns to $V_{DD}$ volts, both nodes 38 and node 50 will be discharged to ground.

The major advantage of the circuit 10 shown in FIG. 1 is that the level J at node 50 has a fast rise time (see transition I) to an intermediate bias voltage which tracks with the MOS threshold voltage, which is a function of various processing parameters. It is a great advantage to have such a voltage at node 50 for certain applications, such as clocking the load device 52 of a CCD regeneration amplifier.

What is claimed is:

1. A circuit for producing a limited output voltage comprising:
    inverter means for producing a first voltage at a first node in response to an input voltage applied to said inverter means;
    output means coupled to said first node for producing a second voltage at a second node in response to said first voltage; and regulator means coupled to said first node and to said second node for limiting said first voltage in response to said second voltage, said regulator means including a plurality of insulated gate field effect transistors coupled in series between said first node and a first voltage conductor, one of said insulated gate field effect transistors having a gate electrode coupled to said second node, and the other of said insulated gate field effect transistors being diode-connected.

2. The circuit as recited in claim 1 wherein said inverter includes:
   a first insulated gate field effect transistor coupled between a second voltage conductor and said first node;
   a second insulated gate field effect transistor coupled between said second voltage conductor and a gate electrode of said first insulated gate field effect transistor;
   capacitor means coupled between a gate electrode and a source electrode of said first insulated gate field effect transistor;
   a third insulated gate field effect transistor coupled between said first node and said first voltage conductor and having its gate electrode coupled to said input of said inverter.

3. The circuit as recited in claim 1 wherein said output means includes a first insulated gate field effect transistor coupled between a second voltage conductor and said second node and having its gate electrode coupled to said first node, and a second insulated gate field effect transistor coupled between said second node and said first voltage conductor.

* * * * *